(12) United States Patent
Park et al.

(10) Patent No.: US 7,923,110 B2
(45) Date of Patent: Apr. 12, 2011

(54) METAL NANOPARTICLE HAVING A SELF-ASSEMBLED MONOLAYER ON ITS SURFACE, AND FORMATION OF CONDUCTIVE PATTERN USING THE SAME

(75) Inventors: Jong Jin Park, Yongin-si (KR); Dong Woo Shin, Seoul (KR); Sung Woong Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1018 days.

(21) Appl. No.: 11/653,889

(22) Filed: Jan. 17, 2007

(65) Prior Publication Data

US 2008/0020317 A1    Jan. 24, 2008

(30) Foreign Application Priority Data

Jul. 21, 2006    (KR) .................. 10-2006-0068501

(51) Int. Cl.
    *B32B 5/16*    (2006.01)
(52) U.S. Cl. ......... 428/403; 977/777; 977/778; 977/779
(58) Field of Classification Search .................. 428/403; 977/778, 779, 777
    See application file for complete search history.

(56) References Cited

U.S. PATENT DOCUMENTS 7,166,412 B2 * 1/2007 Park et al. .................. 430/270.1
7,473,513 B1 * 1/2009 Park et al. .................. 430/281.1

OTHER PUBLICATIONS

Yu Tai Tao, "Structure Comparison of Self-Assembled Monolayers of n-Alkanoic Acids on the Surfaces of Silver, Copper, and Aluminum" J. Am. Chem. Soc. 1993, 115, 4350-4358.
Paul E. Laibinis et al."Comparison of the Structures and Wetting Properties of Self-Assembled Monolayers of n-Alkanethiols on the Coinage Metal Surfaces, Cu, Ag, Au$^1$" J. Am. Chem. Soc. 1991, 113, 7152-7169.
A. N. Goldstein et al., "Melting in Semiconductor Nanocrystals" A. N. Goldstein, C. M. Echer, A. P. Alivisatos vol. 256 Jun. 5, 1992 pp. 1425-1427.
G. Schön et al."A fascinating new filed in colloid science: small ligand-stabilized metal clusters and possible application in microelectronices" Colloid Polym Sci (1995) 275: 101-117.

\* cited by examiner

*Primary Examiner* — H. (Holly) T Le
(74) *Attorney, Agent, or Firm* — Harness, Dickey & Pierce, P.L.C.

(57) ABSTRACT

A metal nanoparticle which is prepared by forming a self-assembled monolayer including a terminal reactive group on the surface thereof, and introducing a functional group capable of being removed by the action of an acid or an base into the terminal reactive group wherein the self-assembled monolayer is built up of a thiol, an isocyanide, an amine, a carboxylate or a phosphate compound having the terminal reactive group, or built up of a thiol, an isocyanide, an amine, a carboxylate or a phosphate compound having no terminal reactive group followed by introducing the terminal reactive group thereto; and a method for forming a conductive pattern using the same are provided. Since the metal nanoparticle of exemplary embodiments of the present invention can easily form a high conductive film or a high conductive pattern through photo-irradiation and photo-degradation and randomly regulate its conductivity when occasions demand, it can be advantageously applied to an antistatic washable sticky film, antistatic shoes, a conductive polyurethane printer roller, an electromagnetic interference shielding, and the like.

18 Claims, 1 Drawing Sheet

METAL NANOPARTICLE HAVING A SELF-ASSEMBLED MONOLAYER ON ITS SURFACE, AND FORMATION OF CONDUCTIVE PATTERN USING THE SAME

BACKGROUND OF THE DISCLOSURE

This non-provisional application claims priority under 35 U.S.C. §119(a) on Korean Patent Application No. 2006-68501 filed on Jul. 21, 2006 which is herein incorporated by reference.

1. Field of the Disclosure

Exemplary embodiments of the present invention relate to a novel metal nanoparticle and a method for forming a conductive pattern using the same. More particularly, exemplary embodiments of the present invention are directed to a novel metal nanoparticle, which is prepared by forming a self-assembled monolayer including a terminal reactive group on the surface thereof, and introducing a functional group capable of being removed by the action of an acid or a base into the terminal reactive group, and a method for forming a conductive pattern using the same. The self-assembled monolayer is built up of a thiol, an isocyanide, an amine, a carboxylate or a phosphate compound having the terminal reactive group, or is built up of a thiol compound and the like having no terminal reactive group followed by introducing the terminal reactive group thereinto.

2. Description of the Related Art

Since a nanosized material shows various electrical, optical and biological properties depending on its one-, two- and three-dimensional space structures and orders, extensive research on the nanosized materials is actively underway worldwide in such diverse application fields as nano-devices, optical information devices, bioelectronic devices, and the like. Especially, among such nanosized materials, a metal nanoparticle has a very wide industrial applicability. This is because when a metal is provided in a nanosized particle in a bulk condition, its surface area is remarkably increased and only a few atoms exist in the nanosized particle, which exhibits unique catalytic, electric, photoelectric and magnetic properties. Further, since the metal nanoparticle having conductivity through an electrical conductive mechanism such as charge transfer or electron transfer has a significantly large specific surface area, a film or a pattern including the metal nanoparticle can exhibit high conductivity although it contains only a small amount of such metal nanoparticle. In addition, if its particle size is regulated to the range from 3 to 15 nm so as to enhance the packing density, electron transfer at an interface between the metals is more greatly facilitated, thereby further improving the conductivity.

Meanwhile, with the advancement of the electronics industry in recent years, research into the development of a highly conductive film or pattern composed of various raw materials is actively progressing. When using the metal nanoparticle, there are several advantages with it being possible to produce a film or a pattern having a high conductivity without the use of a sputtering or an etching process that requires a complicated condition such as the use of a high vacuum or high temperature, and it also is possible to form a conductive pattern in a transparent condition to visible light by regulating the particle size. However, it is very difficult to control and arrange microparticles uniformly in order to apply the metal nanoparticle to a film or a pattern.

One of the methods for effectively arranging the metal nanoparticle that is well-known in the art is a method using a self-assembled monolayer in which compounds having a functional group with chemical affinity to a certain metal are molecularly arranged on the surface of the metal nanoparticle. This method can structurally control the thickness of the self-assembled monolayer to be in the range from 10 to 40 nm. In this regard, Paul E. Laibinis et al. suggest that a self-assembled monolayer is formed by arranging n-alkanethiol on the surface of a metal, and Yu-Tai Tao discloses that a self-assembled monolayer is formed by arranging n-alkanoic acid, dialkyl disulfide or dialkyl sulfide on the surface of a metal such as gold, silver, copper, aluminum, or the like.

However, when using the metal nanoparticle including the well-known self-assembled monolayer, there are several problems such as difficulties in the regulation of the space regularity or molecular orientation, unstability, defects, surface ordering control, and aggregation of the metal nanoparticle when fabricated into a thin film. For the above reasons, therefore, it is impossible to easily prepare a large area film or an ultramicro pattern which has even limited industrial applicability.

Consequently, there is an increasing demand for the development of a new type of a self-assembling nano-construct which is capable of forming a large area film or an ultramicro pattern by using a metal nanoparticle.

SUMMARY OF THE DISCLOSURE

Accordingly, the present inventors have endeavored to overcome the above-mentioned problems and have developed a metal nanoparticle which is prepared by forming a self-assembled monolayer including a terminal reactive group on the surface thereof, and introducing a functional group capable of being removed by the action of an acid or an base into the terminal reactive group. The self-assembled monolayer is made from a thiol, an isocyanide, an amine, a carboxylate or a phosphate compound having the terminal reactive group, or built up of a thiol compound and the like having no terminal reactive group followed by introducing the terminal reactive group thereinto. As a result, the present inventors have found that using such metal nanoparticle is easy to achieve nanoparticle arrangement throughout a large area. Also, it is made possible to form a conductive pattern including the metal nanoparticle on the surface of various kinds of substrates through a conventional photolithography process, without performing an additional sputtering or etching process.

It is, therefore, an object of the invention to provide a novel metal nanoparticle capable of easily forming a large area film or an ultramicro pattern, and a method for forming a pattern using the same.

According to one aspect of the present invention for achieving the above objects, there is provided a metal nanoparticle which is prepared by forming a self-assembled monolayer including a terminal reactive group on the surface thereof, and introducing a functional group capable of being removed by the action of an acid or an base into the terminal reactive group, wherein the self-assembled monolayer is built up of a thiol, an isocyanide, an amine, a carboxylate or a phosphate compound having the terminal reactive group, or is built up of a thiol compound and the like having no terminal reactive group followed by introducing the terminal reactive group thereto.

According to another aspect of the present invention, there is provided a composition comprising the metal nanoparticle; and a metal nanoparticle including a self-assembled monolayer formed on a surface thereof as a linker, wherein the self-assembled monolayer is built up of a compound including a thiol, an isocyanide, an amide, a carboxylate or a phosphate group and an alkoxy silyl group is introduced thereinto.

According to still another aspect of the present invention, there is provided a composition for forming a pattern which comprises one or more of the metal nanoparticle; an organic solvent; one or more photoacid generator or photobase generator; and, one or more additive selected from the group consisting of a conductive polymer, a non-conductive polymer, a photoenhancer, a forming agent, a viscosity regulating agent, a dye, a filler, a flame retardant, a wetting agent and a dispersing agent as needed.

According to a further aspect of the present invention, there is provided a method for forming a pattern using the composition.

BRIEF DESCRIPTION OF THE DRAWINGS

The above and other objects, features and other advantages of embodiments of the present invention will be described in the following detailed exemplary description taken in conjunction with the accompanying drawings, in which.

DESCRIPTION OF EXEMPLARY EMBODIMENTS

Hereinafter, preferred exemplary embodiments of the present invention will be explained in more detail with reference to the accompanying drawings.

A metal nanoparticle of an exemplary embodiment of the present invention has a structure in which a thiol, an isocyanide, an amine, a carboxylate or a phosphate compound having an acid- or a base-degradable group (ABDG) is introduced into one terminal end thereof and forms a self-assembled monolayer on the surface of the metal nanoparticle. Such a structure is schematically shown in FIG. 1.

Figure 1:
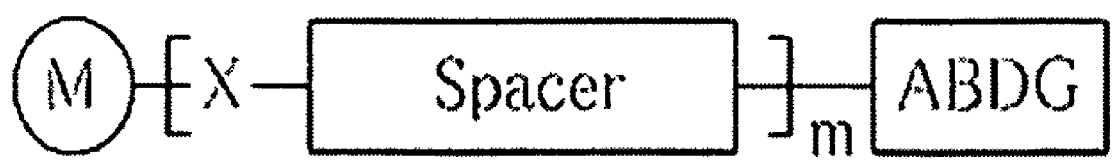
FIG. 1 is a view schematically illustrating a structure of a metal nanoparticle according to an embodiment of the present invention.

In FIG. 1, M is a metal nanoparticle; X is S, NC, NH, COO, or phosphate; Spacer is a polyvalent $C_1$-$C_{30}$ organic group, preferably a polyvalent $C_1$-$C_{12}$ organic group which is capable of containing in its carbon chain at least one moiety selected from the group consisting of —CONH—, —COO—, —CO—, —CH$_2$—, —Si—, bis-(porphyrin),

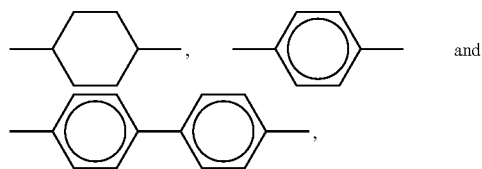

and more preferably a di-, tri-, tetra- and penta-valent organic group; among the acid- and base-degradable groups (ABDG), the acid-degradable group capable of being degraded by the action of an acid is tert-butyloxy carbonyl(t-BOC), acetyl, tetrahydropyran, methoxymethyl ether, p-methoxybenzyl ether, methylthiomethyl ether, trimethylsilyl, tert-butyldimethylsilyl(TBDMS) or triisopropylsilyl(TIPS), and the base-degradable group capable of being degraded by the action of an base is 9-fluorenyl methoxy carbonyl(Fmoc), methyl ester, or silyl ester; and m is an integer ranging from approximately 5 to 5,000, and preferably an integer ranging from approximately 10 to 3,000.

The metal nanoparticle having the structure as shown in FIG. 1 according to an exemplary embodiment of the present invention may be prepared by the following steps of: (i) forming a self-assembled monolayer including a terminal reactive group A on the surface of the metal nanoparticle, wherein the self-assembled monolayer is built up of a thiol, an isocyanide, an amine, a carboxylate, or a phosphate compound having the terminal reactive group A, the compound having a structure represented by the following Formula 1, or is built up of a thiol, an isocyanide, an amine, a carboxylate, or a phosphate compound having no terminal reactive group followed by introducing the terminal reactive group A thereinto, the compound having a structure represented by the following Formula 2; and (ii) introducing an acid- or a base-degradable group (ABDG) capable of being removed by the action of an acid or an base into the terminal reactive group A:

X—Y-A  Formula 1 wherein X is SH, NC, NH$_2$, COOH, or phosphate; Y is a polyvalent $C_1$-$C_{30}$ organic group, preferably a polyvalent $C_1$-$C_{12}$ organic group which is capable of containing in its carbon chain at least one moiety selected from the group consisting of —CONH—, —COO—, —CO—, —CH$_2$—, —Si—, bis-(porphyrin),

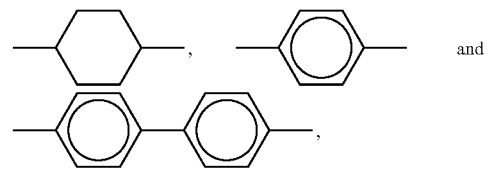

and more preferably a di-, tri-, tetra- and penta-valent organic group; and A is selected from the group consisting of OH, COOH, COCl, NH$_2$, NO$_2$, methoxy, ethoxy, and a halogen atom.

X—Y'  Formula 2 wherein X is SH, NC, NH$_2$, COOH, or phosphate; and Y' is a monovalent $C_1$-$C_{30}$ or a polyvalent $C_1$-$C_{30}$ organic group, preferably a monovalent $C_1$-$C_{12}$ or a polyvalent $C_1$-$C_{12}$ organic group which is capable of containing in its carbon chain at least one moiety selected from the group consisting of —CONH—, —COO—, —CO—, —CH$_2$—, —Si—, bis-(porphyrin),

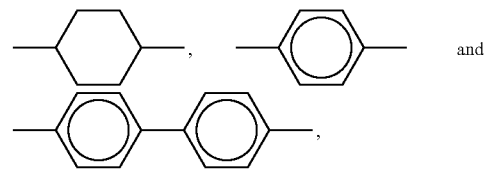

and more preferably a mono-, di-, tri-, tetra- and penta-valent organic group.

At this time, there is no limitation to the kind of a metal nanoparticle used in exemplary embodiments of the present invention, but it is preferable to employ a metal nanoparticle of gold, silver, copper, palladium or platinum having a diameter of approximately 1 nanometer to hundreds of nanometers, preferably approximately 1 to 100 nm, more preferably approximately 1 to 30 nm.

Examples of the compound of Formula 1 or 2 may include, but are not limited to, a thiol compound, an isocyanide compound, an amine compound, a carboxylate compound and a phosphate compound.

The thiol compound may include cystamine(dihydrochloride), 6-mercapto-1-hexanol, 2-mercaptoethanol, 4,4'-thiobiphenol, 1-mercapto-2-propanol, 3-mercapto-1-propanol, 3-mercapto-2-butanol, 3-mercapto-1,2-propandiol, 2,3-dimercapto-1-propanol, dithiotheretol, dithioerythritol, 1,4-dithio-L-theretol, 3-(methylthio)1-propanol, 4-(methylthio) 1-butanol, 3-(methylthio)-1-hexanol, 2,2'-thiodiethanol, 2-hydroxyethyl disulfide, 3,6-dithia-1,8-octandiol, 3,3'-thiodipropanol, 3-methylthio-1,2-propandiol, 3-ethylthio-1,2-propandiol, D-glucose diethyl mercaptal, 1,4-dithiene-2,5-diol, 1,5-dithiacyclooctan-3-ol, 4-hydroxythiophenol, and the like.

The isocyanide compound capable of easily forming a coordinate covalent bond with a metal through a sigma bond (see, *Langumir* 14: 1684, 1998) may include butyl isocyanide, tert-butyl isocyanide, 1,1,3,3-tetramethylbutyl isocyanide, 1,6-diisocyanohexane, cyclohexyl isocyanide, cyanomethyl N,N-dimethyldithiocarbamate, 1-cyano-N-methylthioformamide, benzyl cyanide, 2-naphthylacetonitrile, 4-phenylbutyronitrile, 3-anilinopropionitirle, 3-(benzylamino)propionitrile, 2-methylbenzyl cyanide, 2-fluorophenylacetonitrile, 2-chlorobenzyl cyanide, 2-bromophenylacetonitrile, 3-chlorobenzylcyanide, (3-methoxyphenyl)-acetonitrile, 3-phenoxyphenylacetonitrile, 1,3-phenylenediacetonitrile, 4-hydroxybenzyl cyanide, (4-methoxyphenyl)acetonitrile, 4-aminobenzyl cyanide, 4-nitrophenylacetonitrile, 4'-chloro-2-cyanoacetanilide, 4-cyanophenol, 4-biphenylcarbonitrile, 4'-pentyl-4-biphenylcarbonitrile, 4'-hexyl-4-biphenylcarbonitrile, 4'-hydroxy-4-biphenylcarbonitrile, 9-anthracenecarbonitrile, and the like.

The amine compound may include aniline, 4-ethylaniline, 4-cyclohexylaniline, 2,3-diaminophenol, 3,4-difluoroaniline, 4-aminobiphenyl, 9-aminophenanthrene, 1-aminoindan, 3,5-dimethoxybenzylamine, 3,4,5-trimethoxybenzylamine, 1,9-diaminononane, 1,10-diaminodecane, 1,12-diaminonododecane, tetraethylenepentamine, 1-adamantanamine, and the like.

The carboxylate compound may include octanoic acid, undecanoic acid, undecadioic acid, ethoxyacetic acid, cycloheptane carboxylic acid, 1-adamantaneacetic acid, phenylacetic acid, 6-phenylhexanoic acid, 4-fluorophenylacetic acid, 4-hydroxycinnamic acid, salicylic acid, 4-t-butylbenzoic acid, 1,3,5-benzenetricarboxylic acid, 2,5-dinitrobenzoic acid, 3,5-di-tert-butylbenzoic acid, gallic acid, 4,4'-biphenyldicarboxylic acid, 1-naphtholic acid, 9-fluorenecarboxylic acid, 1-pyrenecarboxylic acid, carbobenzooxyglycine, 6-(carbobenzyloxyamino)-caproic acid, and the like.

The phosphate compound may include diphenyl phosphite, dibenzyl phosphite, bis(4-nitrobenzyl)phosphite, dimethyl(3-phenoxyacetonyl)phosphonate, triphenyl phosphite, benzyl diethyl phosphite, phenyl phosphinic acid, ethyl phenyl phosphate, bis(4-methoxy phenyl)phosphinic acid, dimethyl phenylphosphonite, diethyl phenylphosphonite, diphenyl phosphonic acid, phenyl phosphonic acid, (4-aminobenzyl)phosphonic acid, diphenyl methyl phosphate, 1-naphthyl phosphate, 1,1'-binaphthyl-2,2'-diyl hydrogen phosphate, and the like.

More particularly, the self-assembled monolayer according to exemplary embodiments of the present invention may be formed on the surface of the metal nanoparticle by the following steps of: obtaining a conventional metal nanoparticle by using a method well-known in the art; dispersing the metal nanoparticle together with the compound represented by Formula 1 or 2 in a suitable organic solvent; and stirring for a certain period of time. At this time, any methods well-known in the art can be used for obtaining the metal nanoparticle, without any limitation. For example, the metal nanoparticle may be prepared by reducing an aqueous solution containing metal ions intended to form a nanoparticle with a reducing agent such as citrate, EDTA or $NaBH_4$, in the presence of a surfactant, such as sodium oleate for the stabilization of a particle, or by refluxing a metal hydrazine carboxylate aqueous solution $[M(N_2H_3COO)_2 \cdot 2H_2O$ (M=Mg, Ca, Mn, Fe, Co, Ni, Cu)] of a metal intended to form a nanoparticle at approximately 70 to 90° C., preferably 80° C. as needed.

In addition to the aforesaid method, the metal nanoparticle having a self-assembled monolayer formed thereon may be prepared directly by obtaining a dispersant of a metal particle encompassed with the compound of Formula 1 or 2 in an organic solvent by reacting an organic solution of the compound of Formula 1 or 2 with an aqueous solution containing target metal ions in a phase-transition catalyst; precipitating the metal nanoparticle including the self-assembled monolayer formed on the surface thereof by treating the dispersant with a reducing agent; and centrifuging the resulting dispersant to thereby separate the metal nanoparticle including the self-assembled monolayer formed thereon.

Further, by reacting the metal nanoparticle including the self-assembled monolayer made from the compound of Formula 2 formed on the surface thereof with a compound having the terminal reactive group through a conventional method known in the art, a terminal reactive group may be introduced into the self-assembled monolayer.

Then, the metal nanoparticle obtained above is reacted with a compound including an acid or a base degradable group, thus producing the metal nanoparticle according to exemplary embodiments of the present invention. The term "a compound including an acid- or a base-degradable group" as used herein means a compound including a functional group capable of reacting with the terminal reactive group (A) at one terminal end and a functional group capable of being removed therefrom by the action of an acid or a base at the other terminal end. For example, the acid-degradable group capable of being degraded by the action of an acid may include tert-butyloxy carbonyl(t-moc), acetyl, tetrahydropyran, methoxymethyl ether, p-methoxybenzyl ether, methylthiomethyl ether, trimethylsilyl, tert-butyldimethylsilyl (TBDMS), triisopropylsilyl, and the like; and the base-degradable group capable of being degraded by the action of a base may include 9-fluorenyl methoxy carbonyl(Fmoc), methyl ester, silyl ester, and the like. But, such groups are not limited thereto.

During the preparation procedure of the metal nanoparticle, it can be possible to regulate conductivity of a film or a pattern prepared by using a metal nanoparticle to a desired range by properly regulating the reaction conditions and the concentration of raw materials used therein.

Further, another exemplary embodiment of the present invention provides a metal nanoparticle composition comprising the metal nanoparticle described above and a metal nanoparticle including a self-assembled monolayer made from a compound represented by the following Formula 3 formed on the surface thereof. In this instance, it is advantageous to provide greater uniformity, packing density, adhesiveness and conductivity of a coating.

$$X-Z \quad \text{Formula 3}$$

wherein X is SH, NC, $NH_2$, COOH, or phosphate; and Z is $-(CH_2)_n-Si(OR)R_1R_2$ wherein $R_1$ and $R_2$ are independently $CH_3$ or OR, R is a $C_1$-$C_{20}$ alkyl group, and n is an integer ranging from approximately 1 to 10, preferably $-(CH_2)_n-Si(OR)_3$ or $-(CH_2)_n-Si(OR)(CH_3)_2$ wherein R is a $C_1$-$C_{10}$ alkyl group, and n is an integer ranging from approximately 1 to 6.

The other metal nanoparticle included in the metal nanoparticle composition of exemplary embodiments of the present invention may have a structure where a thiol, an isocyanide, an amine, a carboxylate or a phosphate compound having an alkoxy silyl group introduced into its one terminal end forms a self-assembled monolayer on the surface of the metal nanoparticle. Such a structure is schematically shown in FIG. 2.

Figure 2:
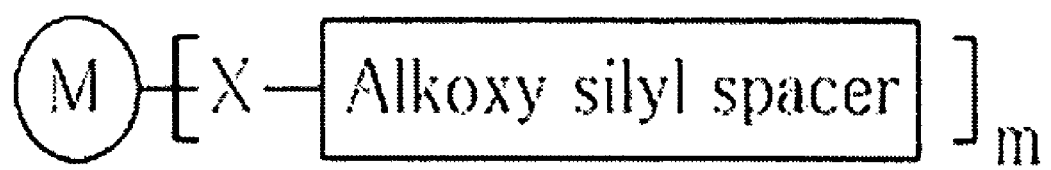
FIG. 2 is a view schematically illustrating a structure of a metal nanoparticle according to another embodiment of the present invention.

In FIG. 2, M is a metal nanoparticle; X is S, NC, NH, COO, or phosphate; Alkoxy silyl spacer is $-(CH_2)_n-Si(OR)R_1R_2$ wherein $R_1$ and $R_2$ are independently $CH_3$ or OR, R is a $C_1$-$C_{20}$ alkyl group, and n is an integer ranging from approximately 1 to 10, preferably $-(CH_2)_n-Si(OR)_3$ or $-(CH_2)_n-Si(OR)(CH_3)_2$ wherein R is a $C_1$-$C_{10}$ alkyl group, and n is an integer ranging from approximately 1 to 6; and m is an integer ranging from approximately 5 to 5,000, preferably an integer ranging from approximately 10 to 3,000.

The metal nanoparticle having the structure as shown in FIG. 2 according to an exemplary embodiment of the present invention may be prepared by forming a self-assembled monolayer using the compound of Formula 3, in which a linker of a thiol, an isocyanide, an amide, a carboxylate or a phosphate group is connected to an alkoxy silyl containing group, on the surface of the metal nanoparticle.

There is no limitation to the kind of the metal nanoparticle used in exemplary embodiments of the present invention, but it is preferable to employ a metal nanoparticle of gold, silver, copper, palladium or platinum having a diameter of approximately one nanometer to hundreds of nanometers, preferably approximately 1 to 100 nm, more preferably approximately 1 to 30 nm.

Examples of the compound represented by Formula 3 may include N-(3-(trimethoxysilyl)propylethylene diamine, 3-aminopropylmethyldimethoxysilane, mercaptomethylmethyldiethoxysilane, m-aminophenyltrimethoxysilane, 4-aminobutyltriethoxysilane, N-(2-aminoethyl)-3-aminopropylmethyldimethoxysilane, 3-mercaptopropyltrimethoxysilane, 3-mercaptopropylmethyldimethoxysilane, 3-mercaptopropyltriethoxysilane, 4-(triethoxysilyl)butyronitrile, 3-(triethoxysilyl)propylthiocyanate, and the like, but are not limited thereto.

More particularly, the self-assembled monolayer may be formed on the surface of the metal nanoparticle according to exemplary embodiments of the present invention by the following steps of: preparing a conventional metal nanoparticle by a typical method in the art; dispersing the metal nanoparticle together with the compound represented by Formula 3 in a suitable organic solvent; and stirring them for a certain period of time. A detailed description thereof is the same as described above, and thus is being omitted here for brevity.

In the metal nanoparticle composition of exemplary embodiments of the present invention, the metal nanoparticles of FIGS. 1 and 2 may be selectively mixed to form of a mixture of one or more thereof at a proper rate by one skilled in the art as needed. In view of the conductivity and adhesiveness, it is preferable to mix the metal nanoparticles of FIGS. 1 and 2 at a mixing ratio of approximately 1:1 to 50:1, more preferably approximately 1:1 to 20:1, however, no particular limitation is imposed thereon.

In addition, another exemplary embodiment of the present invention further provides a composition for forming a pattern which comprises one or more metal of the nanoparticles described above; an organic solvent; one or more photoacid generators or photobase generators; and one or more additives selected from the group consisting of a conductive polymer, a non-conductive polymer, a photoenhancer, a forming agent, a viscosity regulating agent, a dye, a filler, a flame retardant, a wetting agent and a dispersing agent as needed.

The metal nanoparticle used in exemplary embodiments of the present invention may be one or more metal of the nanoparticles as shown in FIGS. 1 and 2. The content of the metal nanoparticle in the composition may differ depending on a thickness or conductivity of a film or a pattern to be obtained, viscosity of the composition, the coating method, and the like. Preferably, the metal nanoparticle is included in the amount of approximately 0.01 to 80% by weight, more preferably approximately 0.1 to 50% by weight, most preferably approximately 1 to 20% by weight based on the total amount of the composition, but is not limited thereto. When using greater than 80% by weight of the metal nanoparticle, there may be a problem in that the coating and printing may not be uniformly achieved.

No particular limitation is imposed on the organic solvent used in exemplary embodiments of the present invention. Preferably, when considering solubility, dispersability and coating application, examples of the organic solvent include propylene glycol methyl ether acetate (PGMEA), dipropylene glycol methyl ether acetate, ethylene glycol mono ethyl ether, 2-methoxyethanol, dimethylformamide(DMF), 4-hydroxy-4-methyl-2-pentanone(PT), methoxy propyl acetate, ethyl-3-ethoxypropionate, cyclohexanone, and the like, but are not limited thereto. These organic solvents may be used alone or in the form of a mixture thereof.

The photoacid generator employable in exemplary embodiments of the present invention include any of the photoacid generators as long as they can generate an acid by light irradiation. Preferable examples of the photoacid generator may include, but are not limited to, an onium photoacid generator, an ionic photoacid generator of a diphenyliodide salt of hydroxy-containing aliphatic sulfonic acid, a DNQ (diazonaphthoquinone) photoacid generator, an nonionic photoacid generator of nitrobenzylsulfonic acid, a polymer photoacid generator, and the like. These photoacid generators may be used alone or in the form of a mixture thereof.

In particular, the onium photoacid generator may have structures represented by the following Formulas 4 to 14; the ionic photoacid generator of a diphenyliodide salt of hydroxy-containing aliphatic sulfonic acid may have a structure represented by the following Formula 15; the DNQ(diazonaphthoquinone) photoacid generator may have a structure represented by the following Formula 16; and the nonionic photoacid generator of nitrobenzylsulfonic acid may have a structure represented by the following Formula 17. Further, the polymer photoacid generator may be a polymer having a molecular weight of approximately 500 to 1,000,000, and contain a sulfonium salt or an iodide salt at a major chain or a branched chain or a photoacid generating group at a branched chain, to thereby generate an acid by light irradiation.

Formula 4

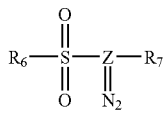

wherein $R_6$ and $R_7$ are independently a $C_1$-$C_{10}$ linear, branched or cyclic alkyl group; and Z is a sulfonyl or a carbonyl group.

Preferred examples of the compound having the structure of Formula 4 may include 1-cyclohexylsulfonyl-1-(1,1-dimethylethylsulfonyl)diazomethane, bis(1,1-dimethylethylsulfonyl)diazomethane, bis(1-methylethylsulfonyl)methane, bis(cyclohexylsulfonyl)diazomethane, 1-cyclohexylsulfonyl-1-cyclohexylcarbonyldiazomethane, 1-diazo-1-cyclohexylsulfonyl-3,3'-dimethylbutane-2-none, 1-diazo-1-methylsulfonyl-4-phenylbutane-2-none, 1-diazo-1-(1,1-dimethylethylsulfonyl)-3,3-dimethyl-2-butanone, 1-acethyl-1-(1-methylethylsulfonyl)diazomethane, and the like.

Formula 5

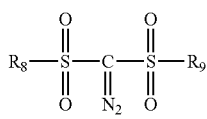

wherein $R_8$ and $R_9$ are independently a hydrogen atom, a halogen atom, a $C_1$-$C_{10}$ linear, branched or cyclic alkyl group, or a $C_1$-$C_{12}$ phenylalkyl group.

Preferred examples of the compound having the structure of Formula 5 may include bis(cyclohexylsulfonyl)diazomethane, bis(p-toluenesulfonyl)diazomethane, methylsulfonyl-p-toluenesulfonyldiazomethane, 1-diazo-1-(p-toluenesulfonyl)-3,3-dimethyl-2-butanone, bis(p-chlorobenzenesulfonyl)diazomethane, cyclohexylsulfonyl-p-toluenesulfonyldiazomethane, and the like.

Formula 6

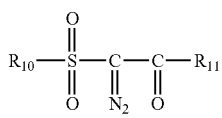

wherein $R_{10}$ and $R_{11}$ are independently a hydrogen atom, a halogen atom, a $C_1$-$C_{10}$ linear, branched or cyclic alkyl group, a $C_1$-$C_{12}$ phenylalkyl group, a phenyl group or a tolyl group.

Preferred examples of the compound having the structure of Formula 6 may include 1-cyclohexylsulfonyl-1-cyclohexylcarbonyl diazomethane, 1-p-toluenesulfonyl-1-cyclohexylcarbonyldiazomethane, 1-diazo-1-(p-toluenesulfonyl)-3,3-dimethylbutane-2-none, 1-diazo-1-benzenesulfonyl-3,3-dimethylbutane-2-none, 1-diazo-1-(p-toluenesulfonyl)-3-methylbutane-2-none, and the like.

Formula 7

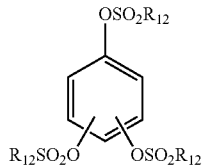

wherein $R_{12}$ is a $C_1$-$C_{12}$ phenylalkyl group or a phenyl group.

Preferred examples of the compound having the structure of Formula 7 may include 1,2,3-tris(trifluoromethanesulfonyloxy)benzene, 1,2,3-tris(2,2,2-trifluoroethanesulfonyloxy)benzene, 1,2,3-tris(2-chloroethanesulfonyloxy)benzene, 1,2,3-tris(p-trifluorobenzenesulfonyloxy)benzene, 1,2,3-tris(p-nitrobenzenesulfonyloxy)benzene, 1,2,3-tris(2,3,4,5-tetrafluorobenzenesulfonyloxy)benzene, 1,2,3-tris(p-fluorobenzenesulfonyloxy)benzene, 1,2,3-tris(methanesulfonyloxy)benzene, 1,2,4-tris(p-trifluoromethyloxybenzenesulfonyloxy)benzene, 1,2,4-tris(2,2,2-trifluoroethanesulfonyloxy)benzene, 1,2,4-tris(2-tienylsulfonyloxy)benzene, 1,3,5-tris(methanesulfonyloxy)benzene, 1,3,5-tris(trifluoromethanesulfonyloxy)benzene, 1,3,5-tris(2,2,2-trifluoroethanesulfonyloxy)benzene, 1,3,5-tris(p-nitrobenzenesulfonyloxy)benzene, 1,3,5-tris(2,3,4,5,6-pentafluorobenzenesulfonyloxy)benzene, 1,3,5-tris(p-fluorobenzenesulfonyloxy)benzene, 1,3,5-tris(2-chloroethanesulfonyloxy)benzene, and the like.

Formula 8

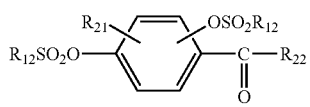

wherein $R_{12}$, $R_{21}$ and $R_{22}$ are independently a $C_1$-$C_{12}$ phenylalkyl group or a phenyl group.

Preferred examples of the compound having the structure of Formula 8 may include 2,3,4-tris(p-fluorobenzenesulfonyloxy)benzophenone2,3,4-tris(trifluolmethanesulfonyloxy)benzophenone, 2,3,4-tris(2-chloroethanesulfonyloxy)benzophenone, 2,3,4-tris(p-trifluoromethylbenzenesulfonyloxy)benzophenone, 2,3,4-tris(p-nitrobenzenesulfonyloxy)benzophenone, 2,3,4-tris(p-fluorobenzenesulfonyloxy)acetophenone, 2,3,4-tris(2,3,4,5,6-pentafluorobenzenesulfonyloxy)acetophenone, 2,3,4-tris(2-nitrobenzenesulfonyloxy)acetophenone, 2,3,4-tris(2,5-dichlorobenzenesulfonyloxy)acetophenone2,3,4-tris(2,3,4-trichlorobenzenesulfonyloxy)acetophenone, 2,2',4,4'-tetra(methanesulfonyloxy)benzophenone, 2,2',4,4'-tetra(2,2,2-trifluoroethanesulfonyloxy)benzophenone, 2,2',4,4'-tetra(2-chloroethanesulfonyloxy)benzophenone2,2',4,4,'-tetra(2,5-dichlorobenzenesulfonyloxy)benzophenone, 2,2',4,4'-tetra(2,4,6-trimethylbenzenesulfonyloxy)benzophenone, 2,2',4,4'-tetra(m-trifluoromethylbenzenesulfonyloxy)benzophenone, and the like.

Formula 9

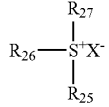

wherein $R_{25}$, $R_{26}$ and $R_{27}$ are independently a $C_1$-$C_{12}$ phenylalkyl group or a phenyl group; and X is methanesulfonate, trifluoromethanesulfonate, p-toluenesulfonate, 10-camphorsulfonate, cyclohexanesulfamate, perfluoro-1-butanesulfonate, Cl, Br, $SbF_6$, $BF_4$, $PF_6$ or $AsF_6$.

Preferred examples of the compound having the structure of Formula 9 may include triphenylsulfonium trifluoromethanesulfonate, triphenylsulfonium perfluorooctanesulfonate, diphenyl-p-torylsulfonium perfluorooctanesulfonate, tris(p-toryl)sulfonium perfluorooctanesulfonate, tris(p-chlorobenzene)sulfonium trifluoromethanesulfonate, tris(p-toryl)sulfonium trifluoromethanesulfonate, trimethylsulfonium trifluoromethanesulfonate, dimethylphenylsulfonium trifluoromethanesulfonate, dimethyltorylsulfoniumtrifluoromethanesulfonate, dimethyltorylsulfonium perfluorooctanesulfonate, triphenylsulfonium p-toluenesulfonate, triphenylsulfonium methanesulfonate, triphenylsulfonium butanesulfonate, triphenylsulfonium n-octanesulfonate, triphenylsulfonium 1-naphthalenesulfonate, triphenylsulfonium 2-naphthalenesulfonate, triphenylsulfonium 10-camphorsulfonate, triphenylsulfonium 2,5-dichlorobenzenesulfonate, diphenyltorylsulfonium 1,3,4-trichlorobenzenesulfonate, dimethyltorylsulfonium p-toluenesulfonate, diphenyltorylsulfonium 2,5-dichlorobenzenesulfonate, triphenylsulfonium chloride, triphenylsulfonium bromide, triphenylsulfonium tetrafluoroborate, triphenylsulfonium pentafluoroantimonate, triphenylsulfonium pentafluorophosphate, triphenylsulfonium pentafluoroarsenate, and the like.

wherein R is a $C_1$-$C_{10}$ alkyl group; and $MXn^-$ is $BF_4^-$, $PF_6^-$, $AsF_6^-$ or $SbF_6^-$.

Formula 12

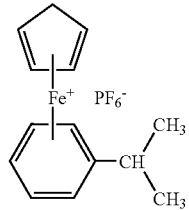

Formula 13

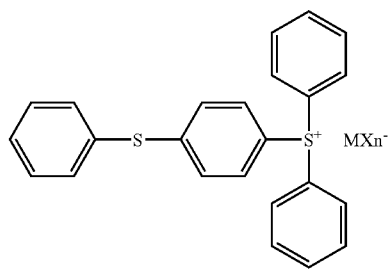

Formula 10

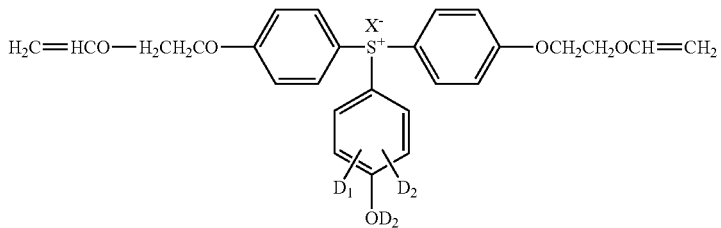

wherein X is methanesulfonate, trifluoromethanesulfonate, p-toluenesulfonate, 10-camphorsulfonate, cyclohexanesulfamate, perfluoro-1-butanesulfonate, Cl, Br, $SbF_6$, $BF_4$, $PF_6$ or $AsF_6$; and $D_1$ and $D_2$ are independently a hydrogen atom, a $C_1$-$C_6$ alkyl group or a vinyloxymethyl group.

wherein $MXn^-$ is $PF_6^-$ or $SbF_6^-$.

Formula 14

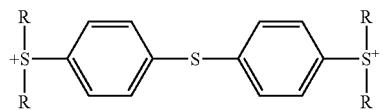

Formula 11

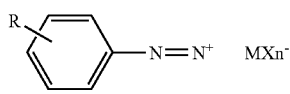

wherein R is a $C_1$-$C_{10}$ alkyl group; and $MXn^-$ is $PF_6^-$ or $SbF_6^-$.

Formula 15

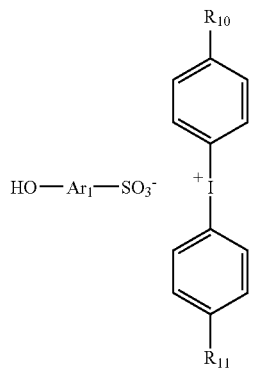
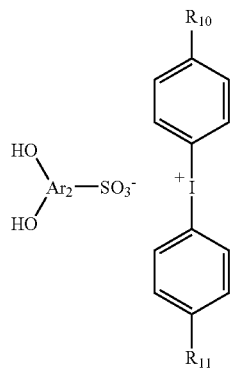

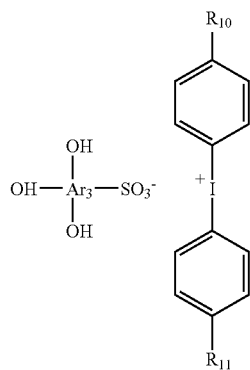

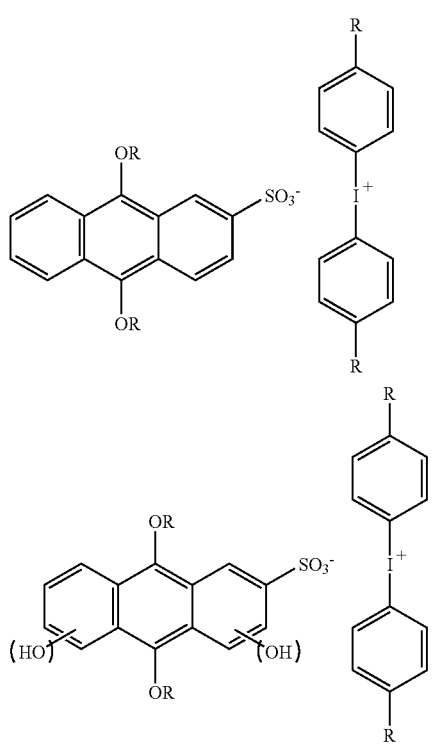

wherein R, $R_{10}$ and $R_{11}$ are independently a $C_1$-$C_{12}$ alkyl or alkox Formula 16

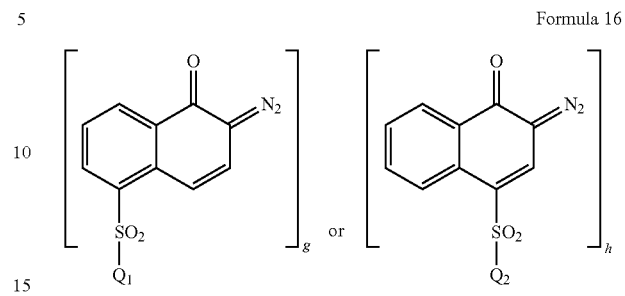

wherein $Q_1$ and $Q_2$ are independently a $C_1$-$C_{12}$ alkyl or aryl group, respectively; g and h are independently an integer greater than 1.

Formula 17

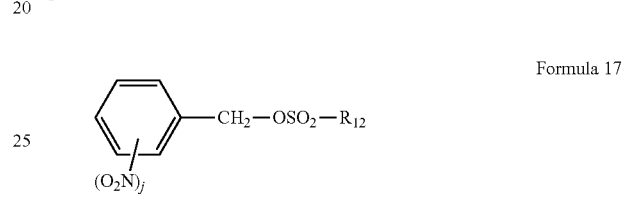

wherein $R_{12}$ is a $C_1$-$C_{12}$ alkyl or aryl group and may include a heteroatom; and j is an integer ranging from 1 to 3.

The amount of the photoacid generator used in the composition of exemplary embodiments of the present invention may be properly determined by one skilled in the art depending on its uses and circumstances. Preferably, the photoacid generator may be included in the amount of approximately 0.01 to 15 parts by weight based on 100 parts by weight of the metal nanoparticle when considering the UV stability of the composition, but is not limited thereto.

Exemplary embodiments of the present invention may employ a photobase generator instead of the photoacid generator. The photobase generator usable in exemplary embodiments of the invention may include any photobase generator as long as such generator can generate a base by light irradiation. Preferable examples of the photobase generator may include a compound represented by the following Formula 18, but is not limited thereto.

Formula 18

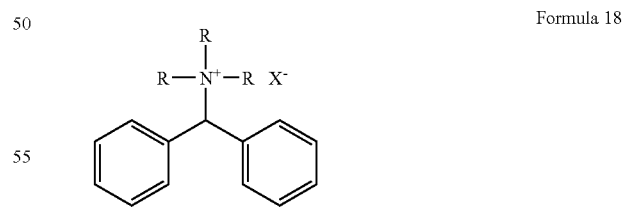

wherein R is methyl, ethyl, propyl or butyl; and X is Br or I.

Preferred examples of the compound having the structure of Formula 18 may include trimethylbenzhydrylammonium iodide, trimethylbenzhydrylammonium triflate, trimethylfluorenylammonium iodide, and the like.

The amount of the photobase generator used in the composition of exemplary embodiments of the present invention may be properly determined by one skilled in the art depending on the particular end use and circumstances. Preferably, the photobase generator may be included in the amount of approximately 0.01 to 15 parts by weight based on 100 parts by weight of the metal nanoparticle when considering the UV stability of the composition, but is not limited thereto.

As described above, the composition for forming a pattern according to exemplary embodiments of the present invention may further comprise one or more of a conductive polymer and a non-conductive polymer as a binder, which are advantageous to provide uniformity and various functionalities to the coating.

Examples of the conductive polymer employable in exemplary embodiments of the present invention may include polyacetylene(PA), polythiophene(PT), poly(3-alkyl) thiophene(P3AT), polypyrrole(PPY), polyisothianapthelene (PITN), polyethylene dioxythiophene(PEDOT), polyparaphenylene vinylene(PPV), poly(2,5-dialkoxy) paraphenylene vinylene, polyparaphenylene(PPP), polyparaphenylene sulphide(PPS), polyheptadiyne(PHT), poly(3-hexyl)thiophene(P3HT), polyaniline(PANI), and a mixture thereof, but are not limited thereto. The number-average molecular weight of the conductive polymer may be preferably from approximately 1,000 to 30,000. The conductive polymer may be included in the amount of approximately 0.1 to 15 parts by weight, preferably approximately 3 to 10 parts by weight based on 100 parts by weight of the metal nanoparticle. When seeking to improve the coating hardness, it is possible to overcoat a commercial epoxy compound having an epoxy acrylate derivative and a glycidyl ether group.

Examples of the non-conductive polymer employable in the present invention include polyester, polycarbonate, polyvinylalcohol, polyvinyl butyral, polyacetal, polyacrylate, polyamide, polyamideimide, polyetherimide, polyphenylene ether, polyphenylene sulfide, polyether sulfone, polyether ketone, polyphthalamide, polyether nitrile, polyether sulfone, polybenzimidazole, polycarbodiimide, polysiloxane, polymethylmetacrylate, polymetacrylamide, nitrile rubber, acryl rubber, polyethylene tetrafluoride, epoxy resin, phenol resin, melamine resin, urea resin, polybutene, polypentene, ethylene-propylene copolymer, ethylene-butene-dien copolymer, polybutadiene, polyisoprene, ethylene-propylene-dien copolymer, butyl rubber, polymethylpentene, polystyrene, styrene-butadiene copolymer, hydrogenated styrene-butadiene copolymer, hydrogenated polyisoprene, hydrogenated polybutadiene, and a mixture thereof, but are not limited thereto. The number-average molecular weight of the non-conductive polymer may be preferably from approximately 3,000 to 30,000, in terms of solubility and printability. The non-conductive polymer may be included in the amount of approximately 0.1 to 10 parts by weight based on 100 parts by weight of the metal nanoparticle.

Further, in order to secure photoreactivity of the photoacid or photobase generator in a broader UV wavelength range, the composition for forming a pattern according to exemplary embodiments of the present invention may selectively comprise a photoenhancer. Examples of the photoenhancer employable in the present invention include 2-ethyl-9,10-dimethoxyanthracene, 9,10-dichloroanthracene, 1-chloroanthracene, 2-methylanthracene, 9-methylanthracene, 2-t-butylanthracene, anthracene, 1,2-benzanthracene, 1,2,3,4-dibenzanthracene, 1,2,5,6-dibenzanthracene, 1,2,7,8-dibenzanthracene, 9,10-dimethoxydimethylanthracene, 2-ethyl-9,10-dimethoxyanthracene, N-methylphenothiazine, isopropylthioxanthone, and the like, but are not limited thereto. The amount of the photoenhancer used in the composition of exemplary embodiments of the present invention be properly determined by one skilled in the art when considering the performance of a photoenhancer, a film thickness, and the like. Preferably, the photoenhancer may be included in the amount of approximately 0.3 to 2 parts by weight based on 100 parts by weight of the metal nanoparticle.

Without departing from the technical spirit of the present invention, the composition of exemplary embodiments of the present invention may further comprise one or more additives, such as a forming agent, a viscosity regulating agent, a dye, a filler, a flame retardant, a wetting agent or a dispersing agent, depending on uses of a coating and a thin film. No particular limitation is imposed on the additives and each of the additives may be any one of well-know materials. The amount of each additive used in the composition may be properly determined by one skilled in the art by taking into consideration the performance of each additive, a film thickness, its use, and the like. Preferably, each of the additives may be included in the amount of approximately 0.01 to 10 parts by weight based on 100 parts by weight of the metal nanoparticle.

If the composition of exemplary embodiments of the present invention is uniformly coated on the surface of a substrate to form a pattern and the substrate is subjected to exposure and development, it is possible to form a conductive film or a conductive pattern according to a simple procedure, without performing a sputtering or an etching process.

More specifically, the method for forming a pattern according to exemplary embodiments of the present invention may comprise the steps of: (a) forming a film by coating the composition of exemplary embodiments of the present invention on the surface of a substrate and volatilizing a solvent therefrom through a pre-drying process; (b) selectively exposing the dried film to ultraviolet rays by using a photomask having a desired pattern; and (c) developing the exposed film with a developing solution.

The material for the substrate employable in exemplary embodiments of the present invention is not particularly limited as long as it does not depart from the technical spirit of exemplary embodiments of the invention, and may be selected from the group consisting of glass, a silicon wafer, a plastic material, and the like according to the desired end use.

The process of coating the composition may be performed through a typical coating process or a typical printing process. Specifically, examples of the coating process may include spin coating, dip coating, spray coating, flow coating, screen coating, and the like, and those of the printing process may include inkjet printing, dip pen printing, imprinting, contact printing, roll printing, and the like, but they are not limited thereto. In view of convenience and uniformity, the most preferable coating method is inkjet printing, imprinting or spin coating. When spin coating, it is preferable to regulate a spin speed within the range from approximately 200 to 3,500 rpm, and an exact spin speed may be determined depending on the composition's viscosity, a film thickness and conductivity.

The process of coating the composition according to exemplary embodiments of the present invention may be exemplified as follows. First, the concentration and viscosity of the metal nanoparticle is regulated to a prescribed range by using Spectra Head (SE 128) and a solvent, such as polyethylene glycol mono methylether acetate or dipropylene glycol methylether acetate. A coating solution, in which the concentration and viscosity of the metal nanoparticle is regulated, is subjected to desired patterning by filling a substrate having a polyimide bank (e.g., 10~30 μm in width and 1~2 μm in height) formed thereon or coating on a glass substrate where the surface thereof is treated with $CF_4$ plasma, hydrophobic fluoride- or siloxane-water repellent through printing or spin coating. The conductivity of a film or a pattern may be randomly regulated by adjusting the concentration of the metal nanoparticle.

After coating the composition, the substrate is subjected to pre-baking at a temperature of approximately 80 to 120° C., preferably 100° C. for about 30 seconds to 5 minutes in order to volatilize the solvent, thereby forming a film on the substrate.

Sequentially, the film thus formed is exposed to ultraviolet rays through an overall exposure process or a selective exposure process using a photomask having a desired pattern, and is developed with a developing solution to remove the unexposed part therefrom. The amount of exposure to ultraviolet rays is preferably from approximately 50 to 800 $mJ/cm^2$. During the exposure process, an acid or a base is generated from the photoacid or photobase generator at the exposed part, respectively, and is reacted with the acid or base degradable group introduced into the surface of the metal nanoparticle to thereby cause the acid or base degradable group to be liberated from the metal nanoparticle. As a result, the film of the exposed part becomes insoluble and exhibits a significantly lower dissolution rate, compared with the unexposed part, when developing with the developing solution in the subsequent developing process. Consequently, such difference in the dissolution rate leaves only the exposed part on the substrate, which forms a desired negative pattern.

No particular limitation is placed on the developing solution used in exemplary embodiments of the present invention unless it obstructs the technical spirit of the invention, and all of the organic developing solutions are usable so long as they are conventionally used in the photolithography field. It is preferred to use DMF, 4-hydroxy-4-methyl-2-pentanone, ethylene glycol monoethlyether or 2-methoxyethanol as a developing solution from the standpoint of coating stability and pattern uniformity.

Meanwhile, after exposing the film formed by the pre-baking process to ultraviolet rays, the film may be subjected to a post-baking at approximately 70 to 120° C., preferably 100° C. for approximately 30 seconds to 5 minutes before the developing process. Through such post-baking process, the acid or base degradable group may be more completely liberated from the metal nanoparticle, thereby obtaining an improved conductive pattern.

Further, after the developing process is completed, the step of firing the developed film at approximately 150 to 400° C. for approximately 30 seconds to 30 minutes may be further performed. In this instance, it is possible to obtain stronger and more dense conductive film and pattern.

Since a film or a pattern formed by using a conductive polymer has conductivity generated by electron transfer from a n-conjugated polymer through a double bond within a molecular chain, there is a problem that the film or pattern becomes light green or brown in order to have sufficient conductivity. However, the film or pattern formed by using the metal nanoparticle according to exemplary embodiments of the present invention exhibits high conductivity while being transparent to visible light. Therefore, the metal nanoparticle of exemplary embodiments of the present invention may be blended with a conductive polymer or a non-conductive polymer as needed, and commercially used in an antistatic washable sticky mat, antistatic shoes, a conductive polyurethane printer roller, a conductive wheel, a conductive industrial roller, an antistatic pressure sensitive adhesive film, an electromagnetic interference shielding, and the like.

Exemplary embodiments of the present invention will now be described in more detail with reference to the following examples. However, these examples are given for the purpose of illustration and are not to be construed as limiting the scope of the invention.

EXAMPLES

Preparative Example 1

Preparation of Gold Nanoparticles

After 50 mM tetraoctylamonium bromide was dissolved in 20 Mℓ of toluene, 25 Mℓ of a hydrogen perculatorate ($HAuCl_4.H_2O$) solution (40 mM) was added thereto and the mixture was stirred. The resulting orange colored solution was mixed with 25 Mℓ of an aqueous solution dissolved with 0.4 g of sodium borohydride ($NaBH_4$) and was reacted for 2 hours with stirring to obtain a dark purple reaction solution. The reaction solution was allowed to stand to separate an organic layer and an aqueous layer. The organic layer was sequentially washed with 0.1 M sulfuric acid, 1 M sodium carbonate solution, and water, dried with $MgSO_4$, filtered with a 0.5 μm PTFE syringe filter, and then was dispersed in organic toluene. It was confirmed by TEM that an organic dispersant of gold nanoparticles having an average particle size of 3~8 nm is obtained. The organic dispersant was centrifuged to remove a supernatant to thereby obtain pure gold nanoparticles.

Preparative Example 2

Preparation of Silver Nanoparticles

After 5 g of $AgNO_3$ was added to 100 Mℓ of distilled water, the resulting solution was mixed with 300 Mℓ of an ice-cold solution of sodium borohydride (NaBH4) at a concentration of $2 \times 10^{-3}$ M and was stirred for 2 hours. The mixture was centrifuged to remove a supernatant and obtain a slurry residue. The slurry residue was dried with $MgSO_4$, mixed with toluene, and then was filtered with a 0.5 μm PTFE syringe filter. It was confirmed by TEM that an organic dispersant of silver nanoparticles having an average particle size of 4-8 nm is obtained. The organic dispersant was again centrifuged to remove a supernatant to thereby obtain pure silver nanoparticles.

Preparative Example 3

Preparation of Copper Nanoparticles 300 mg of copper hydrazine carboxylate (CHC) was prepared by using cupric chloride and hydrazine carboxylate ($N_2H_3COOH$) dissolved in 100 Mℓ of distilled water, and was refluxed at 80° C. for 3 hours under a nitrogen atmosphere. At this time, the change in the solution's color from blue to red reveals that copper showing a metallic property was made in the solution. The organic solution was centrifuged to separate a supernatant, thus obtaining pure copper nanoparticles. It was confirmed by TEM that an organic dispersant of copper nanoparticles having an average particle size of 5-10 nm is obtained.

Preparative Example 4

Preparation of Palladium Nanoparticles

10 Mℓ of 40 mM hydrazine ($N_2H_4$) was added dropwise to 100 Mℓ of a yellow solution dissolved with 15 Mℓ of 5 mM Na$_2$PdCl$_4$ and was reacted for 3 hours, to obtain a brown solution containing palladium nanoparticles. The solution was centrifuged to separate a supernatant, thus obtaining pure palladium nanoparticles. It was confirmed by TEM that an organic dispersant of palladium nanoparticles having an average particle size of 3-10 nm is obtained.

Preparative Example 5

Preparation of Platinum Nanoparticles

5 Mℓ of 0.06 M sodium bodohydride (NaBH$_4$) was mixed with 10 Mℓ of 0.0033 M hydrogen hexachloroplatinate (IV) hexahydrate (H$_2$PtCl$_6$.6H$_2$O), and was stirred and reacted for 2 hours, to thereby obtain a dark brown reaction solution. The reaction solution was allowed to stand to separate an organic layer and an aqueous layer. The organic layer was dried with MgSO$_4$ and was filtered with a 0.5 µm PTFE syringe filter. It was confirmed by TEM that an organic dispersant of platinum nanoparticles having an average particle size of 2-5 nm is obtained.

Example 1

Introduction of an Acid-degradable Group into the Surface of a Gold Nanoparticle After 0.2 g of the gold nanoparticle obtained in Preparative Example 1 was mixed with 50 Mℓ of a mixture of concentrated sulfuric acid and 30% hydrogen peroxide (1:1), the mixture was gently stirred for 20 minutes, diluted with 250 Mℓ of distilled water, and was filtered with a 0.2 µm filter. The filtered residue obtained as described above was washed with 50 Mℓ of methanol five times and dried in a 160° C. oven for 5 hours. Then, 0.1 g of the dried gold nanoparticle was added to 200 Mℓ of toluene together with 1.3 g of 4-cyanophenol and was stirred for 72 hours. The product generated above was filtered with a 0.2 µm filter, was washed with THF twice, and was dried in a 30° C. oven under reduced pressure. After 0.02 g of the resulting product was added to 2 Mℓ of fresh toluene, the mixture was subjected to ultrasonication for 10 minutes, was added with 0.40 Mℓ of triethylamine and 0.22 Mℓ of triethylacethyl chloride, and was reacted for 6 hours. After the reaction was completed, the product was washed with water twice followed by washing with toluene twice, filtered with a 0.2 µm filter, and dried under reduced pressure to thereby obtain the gold nanoparticle having an acid-degradable group introduced into the surface thereof.

Example 2

Introduction of an Acid-degradable Group into the Surface of a Silver Nanoparticle The silver nanoparticle having an acid-degradable group introduced into the surface thereof was obtained according to the same method as described in Example 1 except that 0.2 g of the silver nanoparticle prepared in Preparative Example 2 was employed instead of the gold nanoparticle.

Example 3

Introduction of an Acid-Degradable Group into the Surface of a Copper Nanoparticle The copper nanoparticle having an acid-degradable group introduced into the surface thereof was obtained according to the same method as described in Example 1 except that 0.2 g of the copper nanoparticle prepared in Preparative Example 3 was employed instead of the gold nanoparticle.

Example 4

Introduction of an Acid-degradable Group into the Surface of a Palladium Nanoparticle The palladium nanoparticle having an acid-degradable group introduced into the surface thereof was obtained according to the same method as described in Example 1 except that 0.2 g of the palladium nanoparticle prepared in Preparative Example 4 was employed instead of the gold nanoparticle.

Example 5

Introduction of an Acid-Degradable Group into the Surface of a Platinum Nanoparticle The platinum nanoparticle having an acid-degradable group introduced into the surface thereof was obtained according to the same method as described in Example 1 except that 0.2 g of the platinum nanoparticle prepared in Preparative Example 5 was employed instead of the gold nanoparticle.

Example 6

Introduction of an Alkoxy Silyl Group into the Surface of a Gold Nanoparticle

After 0.2 g of the gold nanoparticle obtained in Preparative Example 1 was mixed with 50 Mℓ of a mixture of concentrated sulfuric acid and 30% hydrogen peroxide (1:1), the mixture was gently stirred for 20 minutes, diluted with 250 Mℓ of distilled water, and was filtered with a 0.2 µm filter. The filtered residue obtained above was washed with 50 Mℓ of methanol five times and dried in a 160° C. oven for 5 hours. Then, 0.1 g of the dried gold nanoparticle and 0.2 g of N-[3-(trimethoxysilyl)propylethylene diamine] were added to 200 Mℓ of toluene and was stirred for 72 hours. The product generated above was filtered with a 0.2 µm filter, was washed with THF two times and was dried in a 30° C. oven under reduced pressure to thereby obtain the gold nanoparticle having a trimethoxysilyl group introduced into the surface thereof.

Example 7

Formation of a Pattern Using a Metal Nanoparticle and Measurement of Conductivity 1

0.1 g of each of the metal nanoparticles obtained in Examples 1 to 5, 10 g of propylene glycol methylether acetate (PGMEA) as a solvent, and 0.001 g of triphenylsulfonium pentafluoroarsenate as a photoacid generator were mixed to prepare a printing composition. The composition was subjected to ultrasonication for 1 hour so as to completely mix each ingredient and was filtered with a 0.5 micron syringe. The filtrate thus obtained was subjected to spin coating on the surface of a glass substrate treated with CF$_4$ Plasma and was dried at 100° C. for 1 minute to remove the residual solvent from the surface. The film thus formed was exposed to UV in the exposure amount of 100 mJ/cm$^2$ by using a photomask having a desired pattern, was post-dried at 100° C. for 1 minute, and then was developed by soaking in 2-methoxyethanol for 20 seconds. Subsequently, the conductive film thus obtained was fired at the temperature of 250 to 400° C. for 1 minute, to prepare a metal nanoparticle membrane having a desired negative pattern formed thereon. Conductivity was measured by calculating a thickness of the membrane with a 4-point probe according to a Jandel Universal 4-Point Probe Station, and the results are shown in Table 1.

TABLE 1

| Sample name | Conductivity(S/cm) × $10^4$ |
| --- | --- |
| Example 1 | 27 |
| Example 2 | 32 |
| Example 3 | 21 |
| Example 4 | 15 |
| Example 5 | 17 |

Example 8

Formation of a Pattern Using a Metal Nanoparticle and Measurement of Conductivity 2

0.1 g of each of the metal nanoparticles obtained in Examples 1 to 5, 0.01 g of the metal nanoparticle obtained in Example 6, 10 g of propylene glycol methylether acetate (PGMEA) as a solvent, and 0.0005 g of triphenylsulfonium pentafluoroarsenate and 0.0005 g of 1-diazo-1-benzenesulfonyl-3,3-dimethylbutane-2-none as a photoacid generator were mixed to prepare a printing composition. The composition was subjected to ultrasonication for 1 hour so as to fully mix each ingredient and was filtered with a 0.5 micron syringe. The filtrate thus obtained was subjected to spin coating on the surface of a glass substrate treated with $CF_4$ Plasma and was dried at 100° C. for 1 minute to remove the residual solvent from the surface. The film thus formed was exposed to UV in the exposure amount of 100 mJ/cm$^2$ by using a photomask having a desired pattern formed thereon, was post-dried at 100° C. for 1 minute, and then was developed by soaking it in 2-methoxyethanol for 20 seconds. Thereafter, the conductive film thus obtained was fired at the temperature of 250 to 400° C. for 1 minute to prepare a metal nanoparticle membrane having a desired negative pattern formed thereon. Conductivity was measured by calculating a thickness of the membrane with a 4-Point probe according to a Jandel Universal 4-Point Probe Station, and the results are shown in Table 2 below.

TABLE 2

| Sample name | Conductivity(S/cm) × $10^4$ |
| --- | --- |
| Example 1 + Example 6 | 13 |
| Example 2 + Example 6 | 21 |
| Example 3 + Example 6 | 14 |
| Example 4 + Example 6 | 12 |
| Example 5 + Example 6 | 11 |

Example 9

Formation of a Conductive Membrane Using a Metal Nanoparticle and a Conductive Polymer 2 g of each of the metal nanoparticles obtained in Examples 1 to 5, 0.5 g of polythiopene (PT) 3% DMF solution as a conductive polymer, 100 g of propylene glycol methylether acetate (PGMEA) as a solvent, and 0.002 g of trimethylbenzhydryl ammonium triplate as a photobase generator were mixed to prepare a printing composition. The composition was subjected to ultrasonication for 1 hour so as to fully mix each ingredient and was filtered with a 0.5 micron syringe. The filtrate thus obtained was subjected to spin coating on the surface of a glass substrate treated with $CF_4$ Plasma and dried at 100° C. for 1 minute to remove the residual solvent from the surface. The film thus formed was exposed to UV in the exposure amount of 100 mJ/cm$^2$ by using a photomask having a desired pattern formed thereon, was post-dried at 100° C. for 2 minutes, and then was developed by soaking in 2-methoxyethanol for 20 seconds. The conductive film thus obtained was fired at the temperature of 250 to 400° C. for 1 minute to prepare a metal nanoparticle membrane having a desired negative pattern formed thereon. Conductivity was measured by calculating a thickness of the membrane with a 4-Point probe, and the results are shown in Table 3.

TABLE 3

| Sample name | Conductivity(S/cm) |
| --- | --- |
| Example 1 + PT | 1500 |
| Example 2 + PT | 2500 |
| Example 3 + PT | 3200 |
| Example 4 + PT | 1800 |
| Example 5 + PT | 4800 |

Example 10

Formation of a Conductive Membrane Using a Metal Nanoparticle and a Non-conductive Polymer 5 g of each of the metal nanoparticles obtained in Examples 1 to 5, 0.1 g of polystyrene (PS)(molecular weight: 5,000) as a non-conductive polymer, 50 g of propylene glycol methylether acetate (PGMEA) and 50 g of dipropylene glycol methylether acetate as a solvent, 0.005 g of 2,2',4,4'-tetra(2,2,2-trifluoroethanesulfonyloxy)benzophenone as a photoacid generator, and 0.05 g of isopropylthioxanthone as a photoenhancer were mixed to prepare a printing composition 16 to 20. The composition was subjected to ultrasonication for 1 hour so as to fully mix each ingredient and was filtered with a 0.5 micron syringe. The filtrate thus obtained was subjected to spin coating on the surface of a glass substrate treated with $CF_4$ Plasma and was dried at 100° C. for 1 minute to remove the residual solvent from the surface. The film thus formed was exposed to UV in the exposure amount of 100 mJ/cm$^2$ by using a photomask having a desired pattern, was post-dried at 100° C. for 1 minute, and was developed by soaking in 2-methoxyethanol for 20 seconds. The conductive film thus obtained was fired at the temperature of 250 to 400° C. for 1 minute, to prepare a metal nanoparticle membrane having a desired negative pattern formed thereon. Conductivity was measured by calculating a thickness of the membrane with a 4-Point probe, and the results are shown in Table 4.

TABLE 4

| Sample name | Conductivity(S/cm) |
| --- | --- |
| Example 1 + PS | 1200 |
| Example 2 + PS | 1400 |
| Example 3 + PS | 1500 |
| Example 4 + PS | 1600 |
| Example 5 + PS | 1700 |

It can be seen from the results of Tables 1 to 4 that a high conductive pattern can be easily formed by using the metal nanoparticle of exemplary embodiments of the present invention without further performing a sputtering or an etching process, and that a film having conductivity more than a certain level can be prepared even though it is mixed with a conductive polymer or a non-conductive polymer. In particular, even when the metal nanoparticle introduced with an alkoxy silyl group is employed, a pattern having excellent adhesiveness can be prepared.

As apparent from the foregoing, since the metal nanoparticle according to exemplary embodiments of the present invention can easily form a high conductive film or a high conductive pattern through photo-irradiation and photo-degradation and randomly regulate its conductivity according to a need, it can be advantageously applied to an antistatic washable sticky film, antistatic shoes, a conductive polyurethane printer roller, an electromagnetic interference shielding, and the like.

Although the preferred embodiments of the present invention have been disclosed for illustrative purposes, those skilled in the art will appreciate that various modifications and variations are possible without departing from the technical spirit of the invention. Accordingly, such modifications and variations are intended to come within the scope of the appended claims.

What is claimed is:

1. A metal nanoparticle having a self-assembled monolayer on a surface thereof, the metal nanoparticle being prepared by forming the self-assembled monolayer including a terminal reactive group A on a surface of a metal nanoparticle, and introducing a functional group being degradable by the action of an acid or a base into the terminal reactive group A, wherein the self-assembled monolayer is formed of a compound represented by Formula 1, or formed of a compound represented by Formula 2 followed by introducing the terminal reactive group A into the self-assembled monolayer:

X—Y-A                Formula 1 wherein X is SH, NC, $NH_2$, COOH, or phosphate; Y is a polyvalent $C_1$-$C_{30}$ organic group; and A is selected from the group consisting of OH, COOH, COCl, $NH_2$, $NO_2$, methoxy, ethoxy, and a halogen atom, and X—Y'                Formula 2 wherein X is SH, NC, $NH_2$, COOH, or phosphate; and Y' is a monovalent $C_1$-$C_{30}$ or a polyvalent $C_1$-$C_{30}$ organic group.

2. The metal nanoparticle having the self-assembled monolayer on the surface thereof according to claim 1, wherein the metal nanoparticle is formed of gold, silver, copper, palladium or platinum, and has a diameter ranging from approximately one nanometer to 100 nanometers;

Y of Formula 1 is a polyvalent $C_1$-$C_{12}$ organic group which is capable of containing in its carbon chain, at least one moiety selected from the group consisting of —CONH—, —COO—, —CO—, —$CH_2$—, —Si—, bis-(porphyrin),

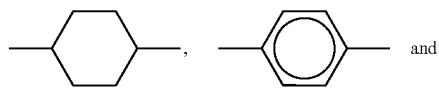

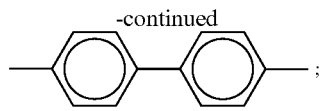

Y' of Formula 2 is a monovalent $C_1$-$C_{12}$ or a polyvalent $C_1$-$C_{12}$ organic group which is capable of containing in its carbon chain, at least one moiety selected from the group consisting of —CONH—, —COO—, —CO—, —$CH_2$—, —Si—, bis-(porpyrin),

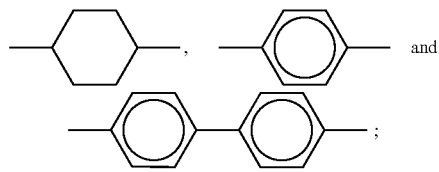

and among the acid and base degradable groups(ABDG), the acid-degradable group being degraded by the action of an acid is selected from the group consisting of tert-butyloxy carbonyl(t-BOC), acetyl, tetrahydropyran, methoxymethyl ether, p-methoxybenzyl ether, methylthiomethyl ether, trimethylsilyl, tert-butyldimethylsilyl(TBDMS), and triisopropylsilyl, and the base-degradable group being degraded by the action of an base is selected from the group consisting of 9-fluorenyl methoxy carbonyl(Fmoc), methyl ester and silyl ester.

3. The metal nanoparticle having the self-assembled monolayer on the surface thereof according to claim 1, wherein the compound of said Formula 1 or 2 is selected from the group consisting of:

thiol compounds including cystamine(dihydrochloride), 6-mercapto-1-hexanol, 2-mercaptoethanol, 4,4'-thiobiphenol, 1-mercapto-2-propanol, 3-mercapto-1-propanol, 3-mercapto-2-butanol, 3-mercapto-1,2-propandiol, 2,3-dimercapto-1-propanol, dithiotheretol, dithioerythritol, 1,4-dithio-L-theretol, 3-(methylthio)1-propanol, 4-(methylthio)1-butanol, 3-(methylthio)-1-hexanol, 2,2'-thiodiethanol, 2-hydroxyethyl disulfide, 3,6-dithia-1,8-octandiol, 3,3'-thiodipropanol, 3-methylthio-1,2-propandiol, 3-ethylthio-1,2-propandiol, D-glucose diethyl mercaptal, 1,4-dithiene-2,5-diol, 1,5-dithiacyclooctan-3-ol and 4-hydroxythiophenol;

isocyanide compounds including butyl isocyanide, tert-butyl isocyanide, 1,1,3,3-tetramethylbutyl isocyanide, 1,6-diisocyanohexane, cyclohexyl isocyanide, cyanomethyl N,N-dimethyldithiocarbamate, 1-cyano-N-methylthioformamide, benzyl cyanide, 2-naphthylacetonitrile, 4-phenylbutyronitrile, 3-anilinopropionitirle, 3-(benzylamino)propionitrile, 2-methylbenzyl cyanide, 2-fluorophenylacetonitrile, 2-chlorobenzyl cyanide, 2-bromophenylacetonitrile, 3-chlorobenzylcyanide, (3-methoxyphenyl)-acetonitrile, 3-phenoxyphenylacetonitrile, 1,3-phenylenediacetonitrile, 4-hydroxybenzyl cyanide, (4-methoxyphenyl)acetonitrile, 4-aminobenzyl cyanide, 4-nitrophenylacetonitrile, 4'-chloro-2-cyanoacetanilide, 4-cyanophenol, 4-biphenylcarbonitrile, 4'-pentyl-4-biphenylcarbonitrile, 4'-hexyl-4-biphenylcarbonitrile, 4'-hydroxy-4-biphenylcarbonitrile and 9-anthracenecarbonitrile;

amine compounds including aniline, 4-ethylaniline, 4-cyclohexylaniline, 2,3-diaminophenol, 3,4-difluoroaniline, 4-aminobiphenyl, 9-aminophenanthrene, 1-aminoindan, 3,5-dimethoxybenzylamine, 3,4,5-trimethoxybenzylamine, 1,9-diaminononane, 1,10-diaminodecane, 1,12-diaminonododecane, tetraethylenepentamine and 1-adamantanamine;

carboxylate compounds including octanoic acid, undecanoic acid, undecadioic acid, ethoxyacetic acid, cycloheptane carboxylic acid, 1-adamantaneacetic acid, phenylacetic acid, 6-phenylhexanoic acid, 4-fluorophenylacetic acid, 4-hydroxycinnamic acid, salicylic acid, 4-t-butylbenzoic acid, 1,3,5-benzenetricarboxylic acid, 2,5-dinitrobenzoic acid, 3,5-di-tert-butylbenzoic acid, gallic acid, 4,4'-biphenyldicarboxylic acid, 1-naphtholic acid, 9-fluorenecarboxylic acid, 1-pyrenecarboxylic acid, carbobenzooxyglycine and 6-(carbobenzyloxyamino)-caproic acid; and phosphate compounds including diphenyl phosphite, dibenzyl phosphite, bis(4-nitrobenzyl)phosphite, dimethyl(3-phenoxyacetonyl)phosphonate, triphenyl phosphite, benzyl diethyl phosphite, phenyl phosphinic acid, ethyl phenyl phosphate, bis(4-methoxyphenyl)phosphonic acid, dimethyl phenylphosphonite, diethyl phenylphosphonite, diphenyl phosphonic acid, phenyl phosphonic acid, (4-aminobenzyl)phosphonic acid, diphenyl methyl phosphate, 1-naphthyl phosphate and 1,1'-binaphthyl-2,2'-diyl hydrogen phosphate.

4. A composition, comprising:
the metal nanoparticle having the self-assembled monolayer on the surface thereof according to claim 1; and
a metal nanoparticle having a self-assembled monolayer formed of a compound represented by the following Formula 3 on a surface thereof:

X—Z                                                                 Formula 3 wherein X is SH, NC, $NH_2$, COOH, or phosphate; and Z is —$(CH_2)_n$—$Si(OR)R_1R_2$ wherein $R_1$ and $R_2$ are independently $CH_3$ or OR, R is a $C_1$-$C_{20}$ alkyl group, and n is an integer ranging from 1 to 10.

5. The composition according to claim 4, wherein the metal nanoparticle having the self-assembled monolayer formed of the compound represented by said Formula 3 on a surface thereof is a metal nanoparticle of gold, silver, copper, palladium or platinum, and has a diameter ranging from one nanometer to 100 nanometers; and
Z of said Formula 3 is —$(CH_2)_n$—$Si(OR)_3$— or —$(CH_2)_n$—$Si(OR)(CH_3)_2$ wherein R is a $C_1$-$C_{10}$ alkyl group, and n is an integer ranging from 1 to 6.

6. The composition according to claim 4, wherein the compound of said Formula 3 is selected from the group consisting of N-(3-(trimethoxysilyl)propylethylene diamine, 3-aminopropylmethyldimethoxysilane, mercaptomethylmethyldiethoxysilane, m-aminophenyltrimethoxysilane, 4-aminobutyltriethoxysilane, N-(2-aminoethyl)-3-aminopropylmethyldimethoxysilane, 3-mercaptopropyltrimethoxysilane, 3-mercaptopropylmethyldimethoxysilane, 3-mercaptopropyltriethoxysilane, 4-(triethoxysilyl)butyronitrile and 3-(triethoxysilyl)propylthiocyanate.

7. The composition according to claim 4, wherein the metal nanoparticle having the self-assembled monolayer on the surface thereof, and the metal nanoparticle having the self-assembled monolayer formed of the compound represented by said Formula 3 on the surface thereof, are included in the ratio ranging from approximately 1:1 to 50:1.

8. A composition for forming a pattern, comprising:
at least one metal nanoparticle selected from the group consisting of the metal nanoparticle having the self-assembled monolayer on the surface thereof according to claim 1, and a metal nanoparticle having a self-assembled monolayer formed of a compound represented by the following Formula 3 on a surface thereof;
an organic solvent; and
at least one material of photoacid generator and photobase generator:

X—Z                                                                 Formula 3 wherein X is SH, NC, $NH_2$, COOH, or phosphate; and Z is —$(CH_2)_n$—$Si(OR)R_1R_2$ wherein $R_1$ and $R_2$ are independently $CH_3$ or OR, R is a $C_1$-$C_{20}$ alkyl group, and n is an integer ranging from approximately 1 to 10.

9. The composition according to claim 8, wherein the at least one metal nanoparticle is included in the amount ranging from approximately 0.01 to 80% by weight.

10. The composition according to claim 8, wherein the photoacid generator is at least one selected from the group consisting of an onium photoacid generator, an ionic photoacid generator of a diphenyliodide salt of hydroxy-containing aliphatic sulfonic acid, a DNQ(diazonaphthoquinone) photoacid generator, an nonionic photoacid generator of nitrobenzylsulfonic acid and a polymer photoacid generator; and the photoacid generator is included in the amount ranging from approximately 0.01 to 15 parts by weight based on 100 parts by weight of the metal nanoparticle.

11. The composition according to claim 8, wherein the photobase generator has a structure represented by the following Formula 18, and is included in the amount ranging from approximately 0.01 to 15 parts by weight based on 100 parts by weight of the metal nanoparticle:

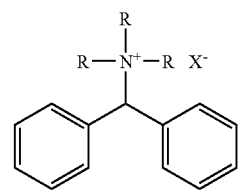

Formula 18 wherein R is methyl, ethyl, propyl or butyl; and X is Br or I.

12. The composition according to claim 8, further comprising at least one additive selected from the group consisting of a conductive polymer, a non-conductive polymer, a photoenhancer, a forming agent, a viscosity regulating agent, a dye, a filler, a flame retardant, a wetting agent and a dispersing agent.

13. The composition according to claim 12, wherein the conductive polymer is at least one selected from the group consisting of polyacetylene(PA), polythiophene(PT), poly(3-alkyl)thiophene(P3AT), polypyrrole(PPY), polyisothianapthelene(PITN), polyethylene dioxythiophene(PEDOT), polyparaphenylene vinylene(PPV), poly(2,5-dialkoxy)paraphenylene vinylene, polyparaphenylene(PPP), polyparaphenylene sulphide(PPS), polyheptadiyne(PHT), poly(3-hexyl)thiophene(P3HT) and polyaniline(PANI); and the conductive polymer is included in the amount ranging from approximately 0.1 to 15 parts by weight based on 100 parts by weight of the at least one metal nanoparticle.

14. The composition according to claim 12, wherein the non-conductive polymer is at least one selected from the group consisting of polyester, polycarbonate, polyvinyl alcohol, polyvinyl butyral, polyacetal, polyacrylate, polyamide, polyamideimide, polyetherimide, polyphenylene ether, polyphenylene sulfide, polyether sulfone, polyether ketone, polyphthalamide, polyether nitrile, polyether sulfone, polybenzimidazole, polycarbodiimide, polysiloxane, polymethylmetacrylate, polymetacrylamide, nitrile rubber, acryl rubber, polyethylene tetrafluoride, epoxy resin, phenol resin, melamine resin, urea resin, polybutene, polypentene, ethylene-propylene copolymer, ethylene-butene-dien copolymer, polybutadiene, polyisoprene, ethylene-propylene-dien copolymer, butyl rubber, polymethyl pentene, polystyrene, styrene-butadiene copolymer, hydrogenated styrene-butadiene copolymer, hydrogenated polyisoprene and hydrogenated polybutadiene; and the non-conductive polymer is included in the amount ranging from approximately 0.1 to 10 parts by weight based on 100 parts by weight of the at least metal nanoparticle.

15. A method for forming a conductive pattern, comprising:
(a) forming a film by coating the composition according to claim 8 on a surface of a substrate, pre-drying the substrate and volatilizing a solvent from the pre-dried substrate;
(b) selectively exposing the dried film to ultraviolet rays by using a photo-mask having a desired pattern; and
(c) developing the exposed film with a developing solution.

16. The method according to claim 15, further comprising post-baking the exposed film, before developing the exposed film.

17. The method according to claim 15, further comprising firing the developed film.

18. The method according to claim 15, wherein the coating includes coating or printing.

* * * * *